United States Patent
Yu

(10) Patent No.: US 12,254,186 B2
(45) Date of Patent: Mar. 18, 2025

(54) I/O EXPANDERS FOR SUPPORTING PEAK POWER MANAGEMENT

(71) Applicant: MICRON TECHNOLOGY, INC., Boise, ID (US)

(72) Inventor: Liang Yu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 17/988,329

(22) Filed: Nov. 16, 2022

(65) Prior Publication Data

US 2023/0195317 A1 Jun. 22, 2023

Related U.S. Application Data

(60) Provisional application No. 63/292,059, filed on Dec. 21, 2021.

(51) Int. Cl.
*G06F 12/00* (2006.01)
*G06F 3/06* (2006.01)

(52) U.S. Cl.
CPC .......... *G06F 3/0613* (2013.01); *G06F 3/0659* (2013.01); *G06F 3/0679* (2013.01)

(58) Field of Classification Search
CPC .... G06F 3/0611; G06F 3/0619; G06F 3/0622; G06F 3/0653
USPC ....................................................... 711/154
See application file for complete search history.

(56) References Cited

U.S. PATENT DOCUMENTS

| | | | | |
|---|---|---|---|---|
| 6,016,560 A | * | 1/2000 | Wada | G11C 29/88 365/195 |
| 11,373,710 B1 | * | 6/2022 | Hsu | G11C 16/30 |
| 2013/0094271 A1 | * | 4/2013 | Schuetz | G06F 13/4234 365/63 |
| 2013/0138868 A1 | * | 5/2013 | Seroff | G06F 13/1684 711/E12.008 |
| 2015/0235677 A1 | * | 8/2015 | Grunzke | G11C 5/04 365/226 |
| 2022/0317876 A1 | * | 10/2022 | Alsop | G06F 3/0679 |

\* cited by examiner

*Primary Examiner* — Mohamed M Gebril
(74) *Attorney, Agent, or Firm* — Lowenstein Sandler LLP

(57) ABSTRACT

A memory device includes sets of memory dies. Each set of memory dies includes a memory dies associated with a respective channel of a plurality of channels, and each channel of the plurality of channels has a respective ready busy (RB) signal. The memory device further includes an input/output (I/O) expander to perform operations including receiving at least one command to perform clock synchronization associated with a clock signal with respect to the plurality of sets of memory dies, and in response to receiving the command, causing circuitry of the I/O expander to be configured to create an RB signal short with respect to a particular combination of channels. The clock synchronization is associated with peak power management (PPM) initialization.

20 Claims, 12 Drawing Sheets

I/O EXPANDERS FOR SUPPORTING PEAK POWER MANAGEMENT

RELATED APPLICATIONS

This application claims the benefit of U.S. Provisional Patent Application No. 63/292,059, filed on Dec. 21, 2021 and entitled "I/O Expanders for Supporting Peak Power Management", the entire contents of which are incorporated by reference herein.

TECHNICAL FIELD

Embodiments of the disclosure relate generally to memory sub-systems, and more specifically, relate to input/output (I/O) expanders for supporting peak power management (PPM).

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
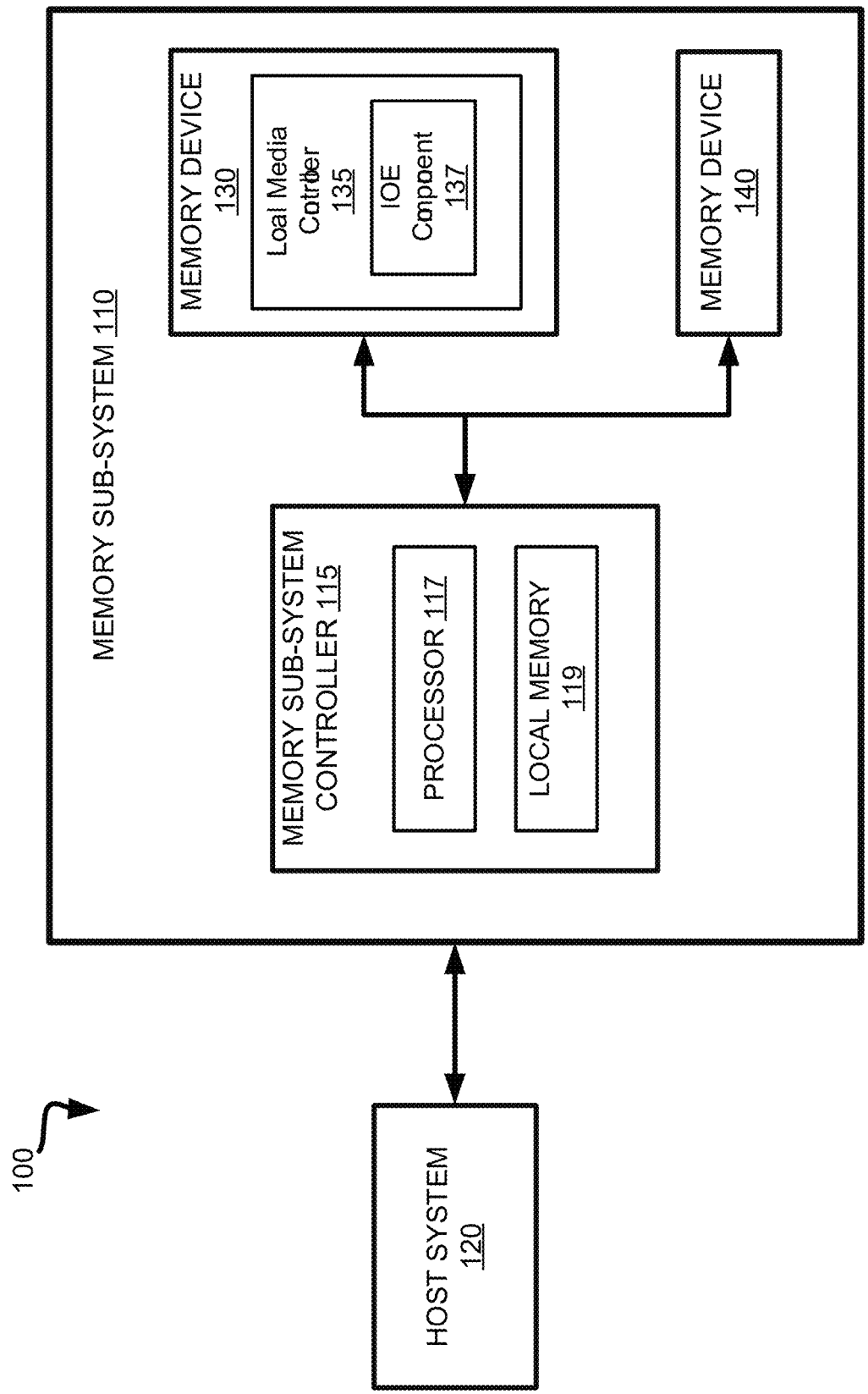
FIG. 1A illustrates an example computing system that includes a memory sub-system in accordance with some embodiments of the present disclosure.

Aspects of the present disclosure are directed to input/output (I/O) expanders for supporting peak power management (PPM). A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple bits arranged in a two-dimensional or three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory device can be a three-dimensional (3D) memory device. For example, a 3D memory device can be a three-dimensional (3D) replacement gate memory device (e.g., 3D replacement gate NAND), which is a memory device with a replacement gate structure using wordline stacking. For example, a 3D replacement gate memory device can include wordlines, select gates, etc. located between sets of layers including a pillar (e.g., polysilicon pillar), a tunnel oxide layer, a charge trap (CT) layer, and a dielectric (e.g. oxide) layer. A 3D replacement gate memory device can have a "top deck" corresponding to a first side and a "bottom deck" corresponding to a second side. For example, the first side can be a drain side and the second side can be a source side. Data in a 3D replacement gate memory device can be stored as 1 bit/memory cell (SLC), 2 bits/ memory cell (MLC), 3 bits/memory cell (TLC), etc.

The capacitive loading of 3D memory is generally large and may continue to grow as process scaling continues. Various access lines, data lines and voltage nodes can be charged or discharged very quickly during sense (e.g., read or verify), program, and erase operations so that memory array access operations can meet the performance specifications that are often required to satisfy data throughput targets as might be dictated by customer requirements or industry standards, for example. For sequential read or programming, multi-plane operations are often used to increase the system throughput. As a result, a typical memory device can have a high peak current usage, which might be four to five times the average current amplitude. Thus, with such a high average market requirement of total current usage budget, it can become challenging to operate more than four memory devices concurrently, for example.

A variety of techniques have been utilized to manage power consumption of memory sub-systems containing multiple memory devices, many of which rely on a memory sub-system controller to stagger the activity of the memory devices seeking to avoid performing high power portions of access operations concurrently in more than one memory device. For example, in a memory package including multiple memory devices (e.g., multiple separate dies), there can be a peak power management (PPM) system, where each memory device can include a PPM component configured to perform power or current budget arbitration for the respective memory device. For example, each PPM component can implement predictive PPM to perform predictive power budget arbitration for the respective memory device.

The memory sub-system can employ a token-based round robin protocol, whereby each PPM component rotates (e.g., after a set number of cycles of a shared clock signal) as a holder of the token and broadcasts a quantized current budget consumed by its respective memory device during a given time period. The other PPM components on the other memory devices receive this broadcast information and thus, can determine an available current budget in the memory sub-system during the time period. While holding the token, a PPM component can request a certain amount of current for its respective memory device up to the available current budget in the memory sub-system. The PPM component can employ a number of different techniques to allocate the requested current among the multiple processing threads of the respective memory device.

An input/output (I/O) expander is a component that is used to monitor and/or control peripheral signals. An I/O expander can connect to a processing device (e.g., microprocessor) via a bidirectional serial interface, and can free up general-purpose I/O (GPIO) on the processing device. For example, An I/O expander can be used to reduce memory device (e.g., NAND) I/O loading impact. In some implementations, the memory device can be a multi-die memory device implementing PPM.

An I/O expander can implement a number of ready/busy (RB) signals corresponding to respective channels. The RB signal can be an "active-low" signal, in which the corresponding RB pin is active when set to a logical low stage (e.g., 0 V). For example, an I/O expander can implement 4 RB # signals each corresponding to a respective channel $CH_A$ through $CH_D$. Such an I/O expander can include a multiplexing (MUX) mode that can check the RB signal status for each individual channel or die, and/or AND logic that receives the RB signal from each channel to determine whether at least one die is currently busy. Each of these functions can be controlled by a set of commands (e.g., one or more I/O expander configuration commands and/or one or more set feature commands). For example, the RB signal can be "low" when a command is running, and can be "high" when a command is finished. Accordingly, the MUX mode and/or the AND logic can receive the back-end RB signals from each of the channels, and generate an output from the back-end RB signals (e.g., a single front-end RB signal).

To implement PPM with respect to a PPM group or package, one die of a set of dies corresponding to a channel can be designated a "primary die" that generates a clock signal (ICLK) received by other "secondary" dies of the PPM group. RB signals of a PPM group can be used to trigger automatic ICLK synchronization during PPM initialization, so that the RB signals can be shorted together. For example, if there is any die of the PPM group that is busy (at least one die is running a command), the primary die can identify a falling edge of the RB signal (which indicates the existence of a busy die) and can initiate ICLK to run. Similarly, if all dies of the PPM group are ready (none of the dies is running a command), the primary die can identify a rising edge of the RB signal (which indicates that all dies are ready dies) and can stop ICLK to save power. PPM can enable other workarounds, such as manual ICLK start, that can force ICLK to run regardless of RB signal status. However, such workarounds can consume additional power, which may be unacceptable. Although automatic ICLK synchronization may be preferable over such other workarounds, current I/O expander implementations with respect to multi-die memory devices do not include RB signal shorting to enable automatic ICLK synchronization during PPM.

Aspects of the present disclosure address the above and other deficiencies by implementing I/O expanders for supporting peak power management. The I/O expander can leverage RB signals generated by channels of a memory device to trigger ICLK synchronization during PPM initialization. More specifically, the I/O expander can be used to create an RB signal short (e.g., back-end RB signal short) with respect to any desired combination of channels. For example, in a four-channel implementation, the I/O expander can create an RB signal short with respect to $CH_A$ and $CH_B$. As another example, in the four-channel implementation, the I/O expander can create an RB signal short with respect to $CH_C$ and $CH_D$. As yet another example, in the four-channel implementation, the I/O expander can create an RB signal short with respect to $CH_A$ through $CH_D$. Such combinations of channels should not be considered limiting. The I/O expander can include an I/O expander component having a number of circuit elements including a number of switches. The switches can be controlled by a command that indicates which of the switches to open and which of the switches to close to create an RB signal short with respect to a particular combination of channels. For example, the command can be a set feature command (e.g., FA87h[3:2] command).

Advantages of the present disclosure include, but are not limited to, improved memory device performance and quality of service (QOS).

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement an I/O expander (IOE) component 137 that can implement an I/O expander for supporting PPM. In such an embodiment, IOE component 137 can be implemented using hardware or as firmware, stored on memory device 130, executed by the control logic (e.g., local media controller 135) to perform the operations related to performing PPM during a program/erase suspend status as described herein. For example, memory device 130 can include multiple individual NAND memory die, where each I/O expander can support up to four expansion channels, where each expansion channel can support up to four NAND memory die. Accordingly, each I/O expander can support up to 16 separate memory die while providing a buffering scheme that does not increase the impedance load on the existing host channel of the memory sub-system controller 115. In another embodiment, the I/O expanders can be implemented in another portion of memory device 130, or in another circuit coupled between memory sub-system controller 115 and memory device 130. For example, in another embodiment, memory device 130 can instead represent a single memory die which can be coupled to an expansion channel provided by an I/O expander. Depending on the embodiment, each host channel can include multiple I/O expanders, such as two I/O expanders (i.e., 32 memory devices) or even up to four I/O expanders (i.e., 64 memory devices). Since the impedance load of the additional memory devices is not presented on the host channel, the memory sub-system controller can still utilize the host channel at a maximum data rate acceptable for operations of host system 120.

In one embodiment, the IOE component 137 can be implemented within an IOE, which can further include a multiplexer (MUX) and/or AND logic. The IOE can receive a number of RB signals each corresponding to a particular channel associated with a respective set of dies. The IOE component 137 can include circuitry that can utilize the RB signals to trigger ICLK synchronization with respect to the memory device 130 during PPM. More specifically, the IOE component 137 can create an RB signal short (e.g., back-end RB signal short) with respect to any desired combination of channels. For example, in a four-channel implementation, the IOE component 137 can create an RB signal short with respect to $CH_A$ and $CH_B$. As another example, in the four-channel implementation, the IOE component 137 can create an RB signal short with respect to $CH_C$ and $CH_D$. As yet another example, in the four-channel implementation, the IOE component 137 can create an RB signal short with respect to $CH_A$ through $CH_D$. Such combinations of channels should not be considered limiting. Accordingly, the IOE component 137 can be referred to as an RB signal shorting component.

The circuitry of the IOE component 137 can include a collection of circuit elements that can cause targeted RB signal shorts with respect to the RB signals. For example, the circuitry of the IOE component 137 can include a number of switches. The switches can be controlled by one or more commands that identify which of the switches to open and which of the switches to close to create an RB signal short with respect to a particular combination of channels. For example, the one or more commands can include a set feature command (e.g., FA87h[3:2] command).

Further details regarding the operations of the IOE component 137 are described above, and will be described below with reference to FIGS. 5-8.

Figure 1B:
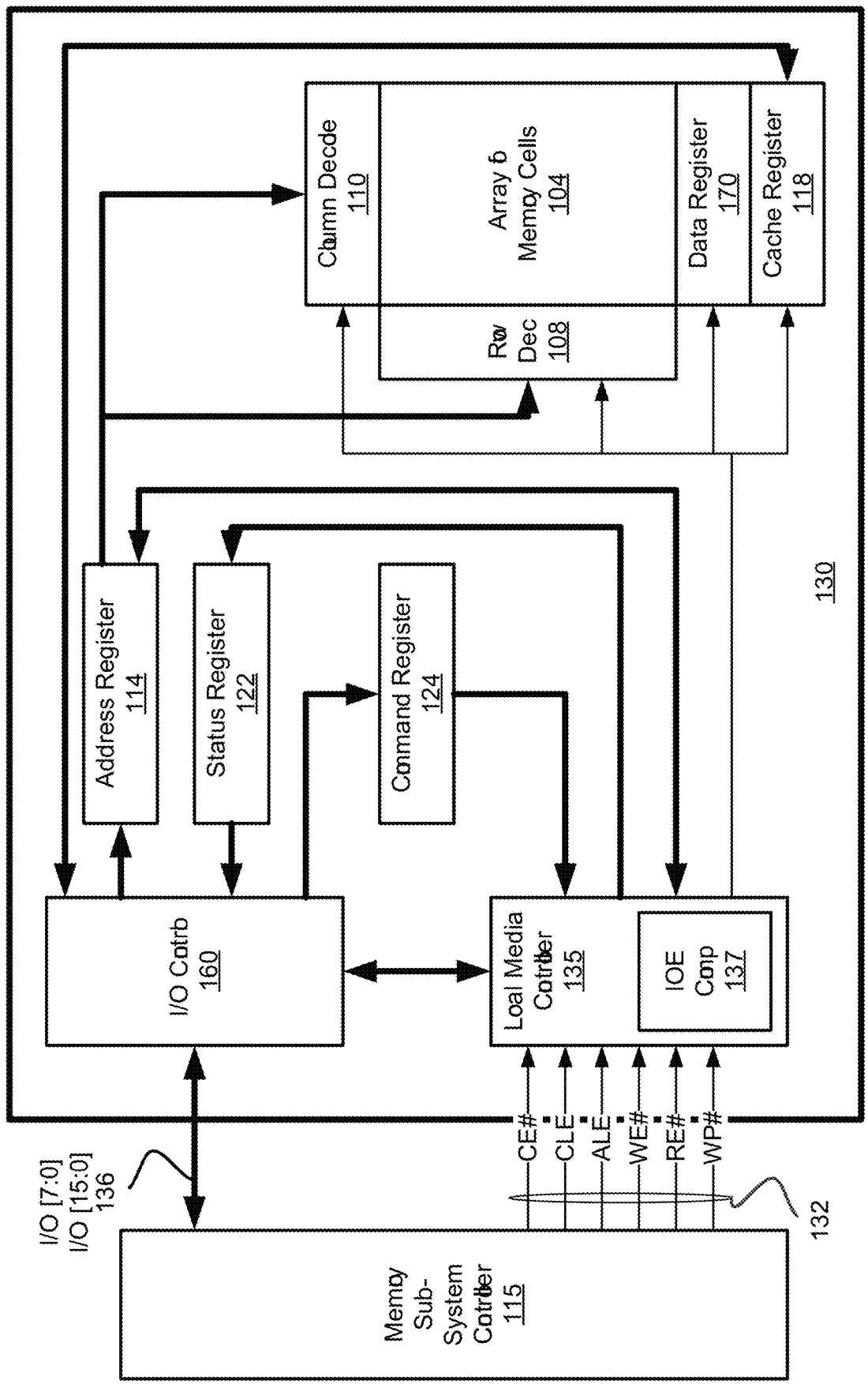
FIG. 1B is a block diagram of a memory device in communication with a memory sub-system controller of a memory sub-system in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 110 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 110 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 110 to control the row decode circuitry 108 and column decode circuitry 110 in response to the addresses. In one embodiment, local media controller 135 includes the IOE component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
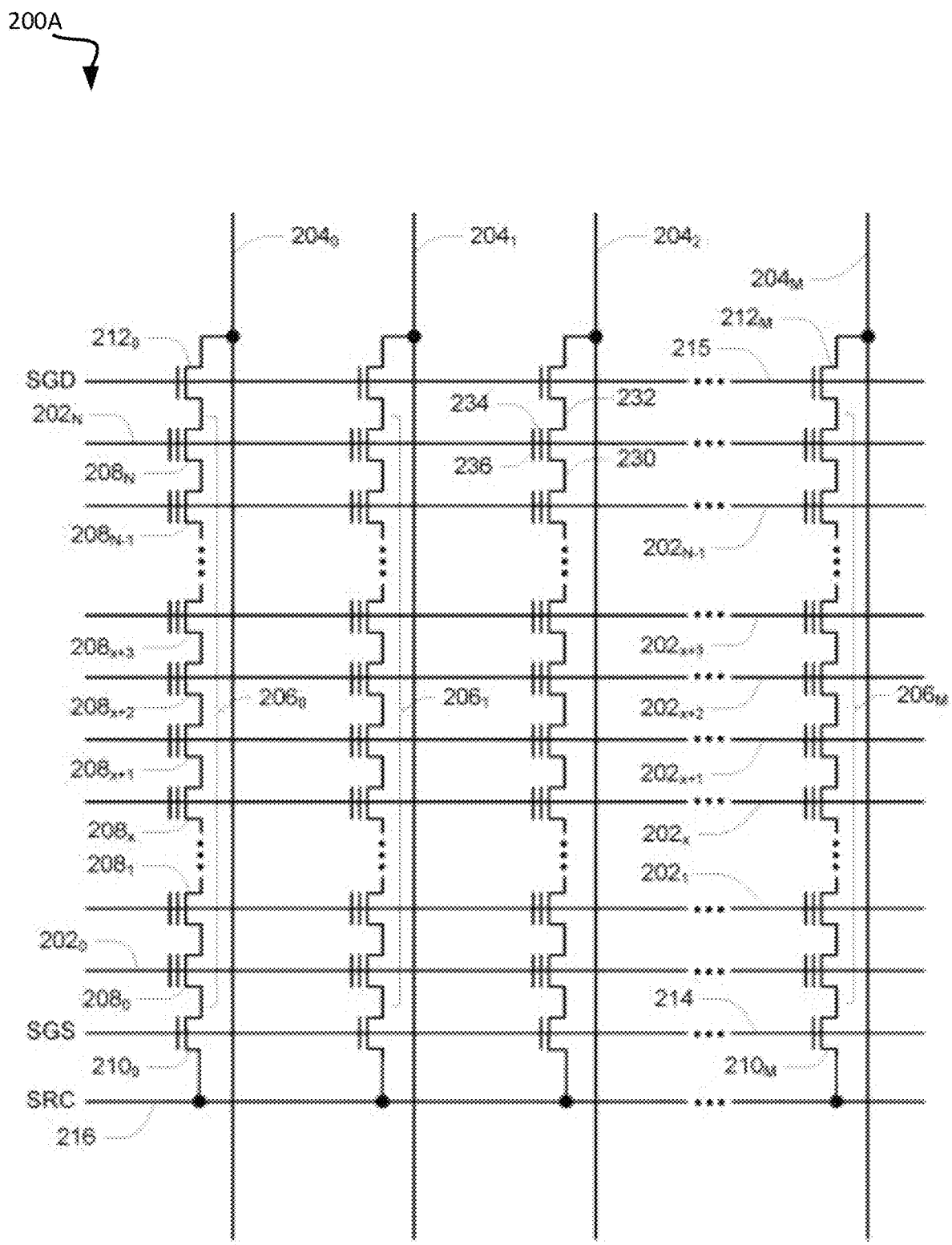
FIGS. 2A-2C are diagrams of portions of an example array of memory cells included in a memory device, in accordance with some embodiments of the present disclosure.
Figure 2B:
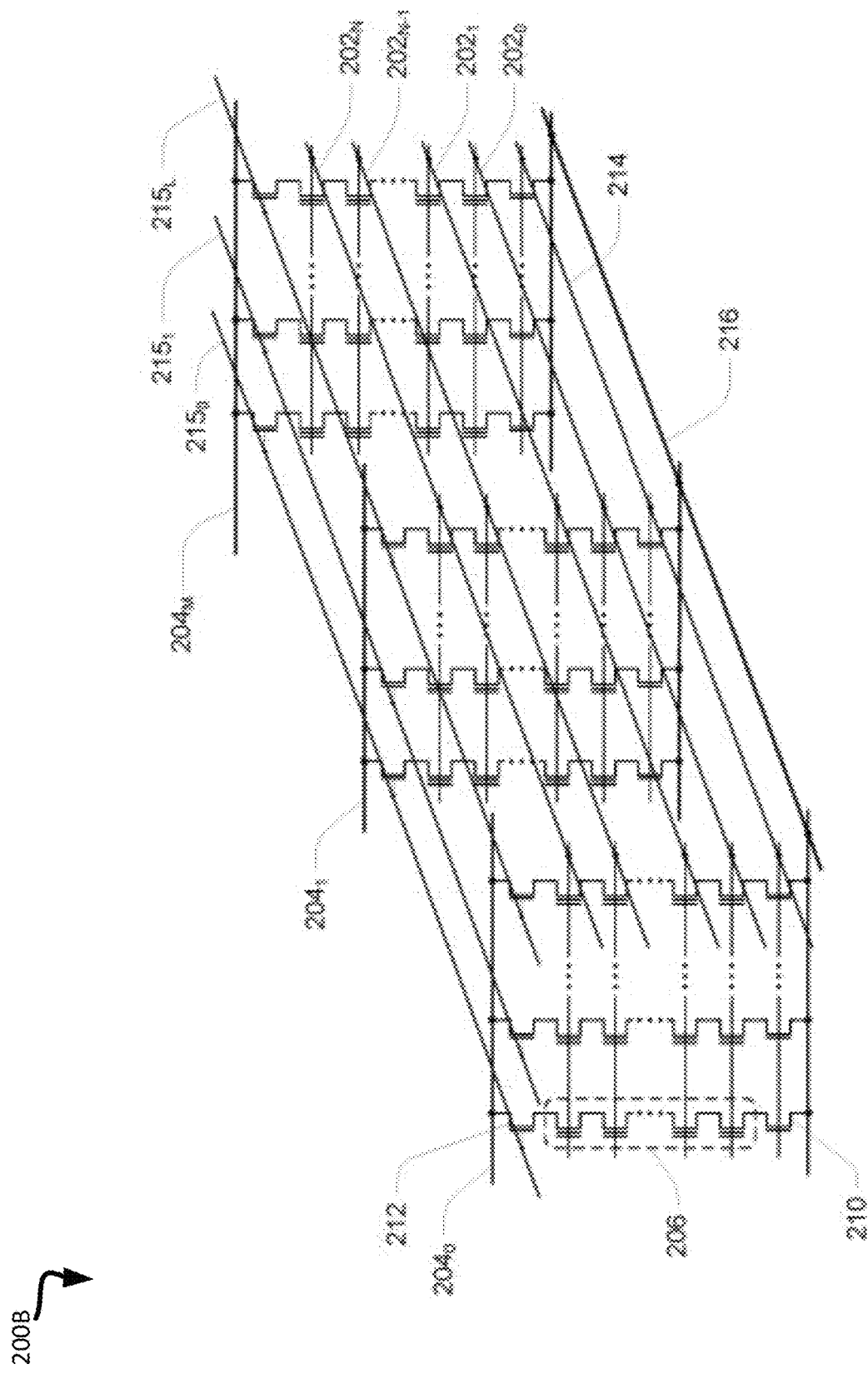
Figure 2C:
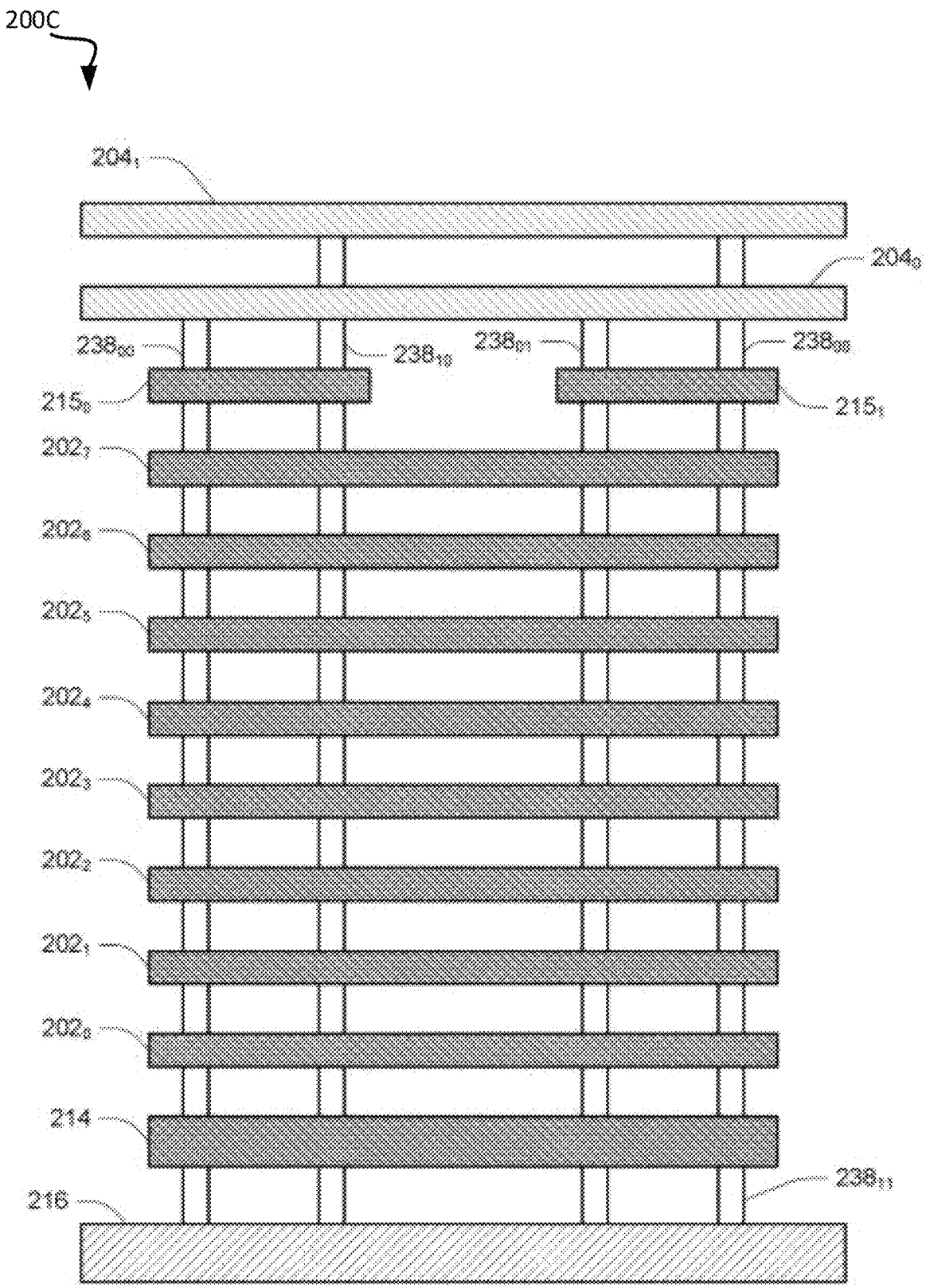

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104).

Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Subsets of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) $238_{00}$ and $238_{01}$ represent the channel regions of different strings of series-connected memory cells (e.g., strings 206 of FIGS. 2A-2B) selectively connected to the bitline $204_0$. Similarly, channel regions $238_{10}$ and $238_{11}$ represent the channel regions of different strings of series-connected memory cells (e.g., NAND strings 206 of FIGS. 2A-2B) selectively connected to the bitline $204_1$. A memory cell (not depicted in FIG. 2C) may be formed at each intersection of an wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

Figure 3:
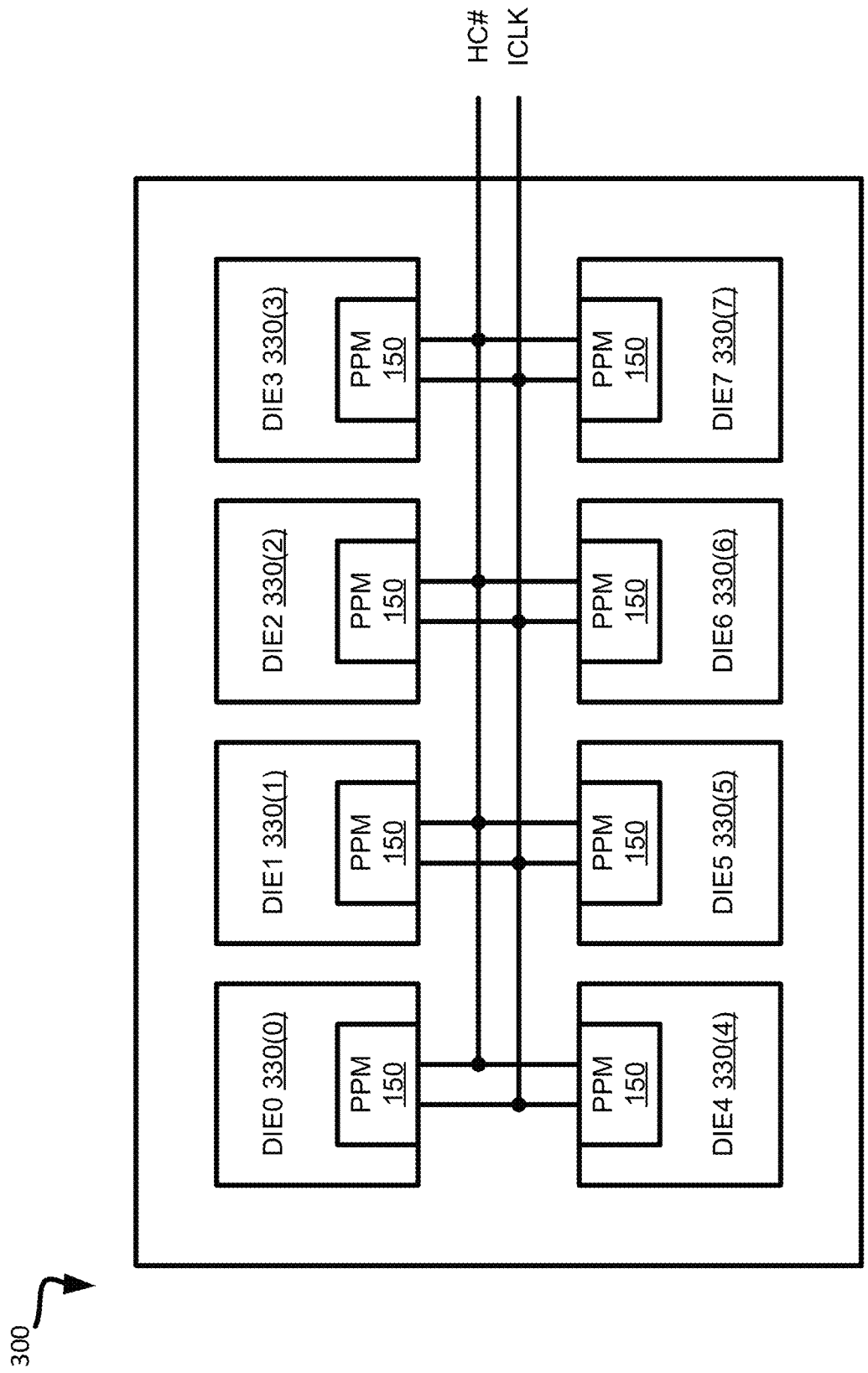
FIG. 3 is a block diagram illustrating a multi-die package with multiple memory dies in a memory sub-system, in accordance with some embodiments of the present disclosure.

FIG. 3 is a block diagram illustrating a multi-die package 300 with multiple memory dies in a memory sub-system, in accordance with some embodiments of the present disclosure. As illustrated, multi-die package 300 includes memory dies 330(0)-330(7). In other embodiments, however, multi-die package 300 can include some other number of memory dies, such as additional or fewer memory dies. In one embodiment, memory dies 330(0)-330(7) share a clock signal ICLK which is received via a clock signal line. Memory dies 330(0)-330(7) can be selectively enabled in response to a chip enable signal (e.g. via a control link), and can communicate over a separate I/O bus. In addition, a peak current magnitude indicator signal HC # is commonly shared between the memory dies 330(0)-330(7). The peak current magnitude indicator signal HC # can be normally pulled to a particular state (e.g., pulled high). In one embodiment, each of memory dies 330(0)-330(7) includes an instance of a PPM component, which receives both the clock signal ICLK and the peak current magnitude indicator signal HC #.

In one embodiment, a token-based protocol is used where a token cycles through each of the memory dies 330(0)-330(7) for determining and broadcasting expected peak current magnitude, even though some of the memory dies 330(0)-330(7) might be disabled in response to PPM function disabling. The period of time during which a given PPM component holds this token (e.g. a certain number of cycles of clock signal ICLK) can be referred to herein as a power management cycle of the associated memory die. At the end of the power management cycle, the token is broadcast to the other memory dies. Eventually the token is received again by the same PPM component, which signals the beginning of the power management cycle for the associated memory die. In one embodiment, the encoded value for the lowest expected peak current magnitude is configured such that each of its digits correspond to the normal logic level of the peak current magnitude indicator signal HC # where the disabled dies do not transition the peak current magnitude indicator signal HC #. In other embodiments, however, the memory dies can be configured, when otherwise disabled in response to their respective chip enable signal, to drive transitions of the peak current magnitude indicator signal HC # to indicate the encoded value for the lowest expected peak current magnitude upon being designated. When a given PPM component holds the token, it can determine the peak current magnitude for the respective one of memory die 330(0)-330(7), which can be attributable to one or more processing threads on that memory die, and broadcast an indication of the same via the peak current magnitude indicator signal HC #. During a given power management cycle, the PPM component can arbitrate among the multiple processing threads on the respective memory die using one of a number of different arbitration schemes in order to allocate that peak current to enable concurrent memory access operations.

Figure 4:
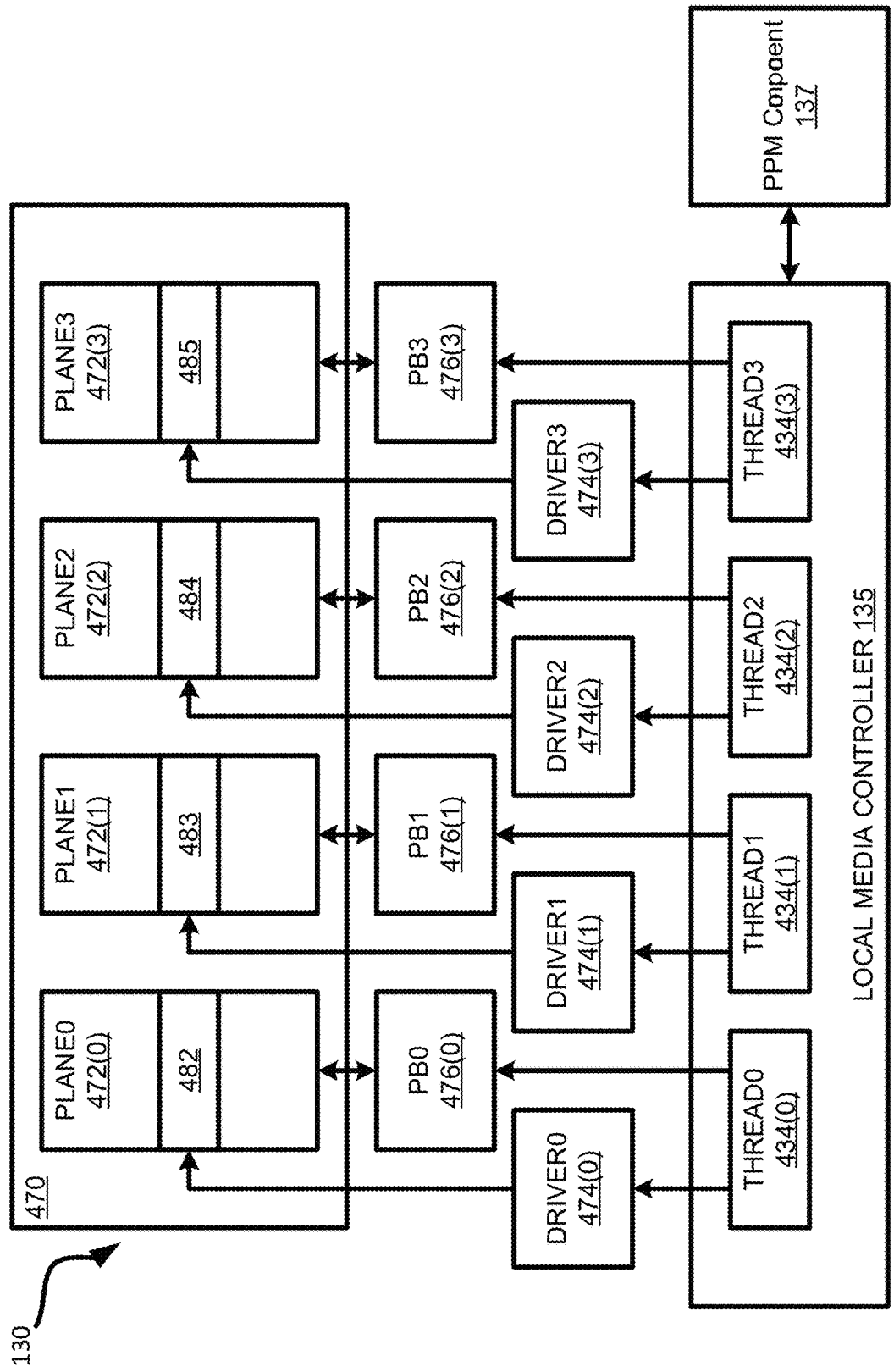
FIG. 4 is a block diagram illustrating a multi-plane memory device configured for independent parallel plane access, in accordance with some embodiments of the present disclosure.

FIG. 4 is a block diagram illustrating a multi-plane memory device 130 configured for independent parallel plane access, in accordance with some embodiments of the present disclosure. The memory planes 472(0)-472(3) can each be divided into blocks of data, with a different relative block of data from two or more of the memory planes 472(0)-472(3) concurrently accessible during memory access operations. For example, during memory access operations, two or more of data block 482 of the memory plane 472(0), data block 483 of the memory plane 472(1), data block 484 of the memory plane 372(2), and data block 485 of the memory plane 4372(3) can each be accessed concurrently.

The memory device 130 includes a memory array 470 divided into memory planes 472(0)-472(3) that each includes a respective number of memory cells. The multi-plane memory device 130 can further include local media controller 135, including a power control circuit and access control circuit for concurrently performing memory access operations for different memory planes 472(0)-472(3). The memory cells can be non-volatile memory cells, such as NAND flash cells, or can generally be any type of memory cells.

The memory planes 472(0)-472(3) can each be divided into blocks of data, with a different relative block of data from each of the memory planes 472(0)-472(3) concurrently accessible during memory access operations. For example, during memory access operations, data block 482 of the memory plane 472(0), data block 383 of the memory plane 472(1), data block 484 of the memory plane 472(2), and data block 385 of the memory plane 472(3) can each be accessed concurrently.

Each of the memory planes 472(0)-372(3) can be coupled to a respective page buffer 476(0)-476(3). Each page buffer 476(0)-376(3) can be configured to provide data to or receive data from the respective memory plane 472(0)-472(3). The page buffers 476(0)-476(3) can be controlled by local media controller 135. Data received from the respective memory plane 472(0)-472(3) can be latched at the page buffers 476(0)-476(3), respectively, and retrieved by local media controller 135, and provided to the memory sub-system controller 115 via the NVMe interface.

Each of the memory planes 472(0)-472(3) can be further coupled to a respective access driver circuit 474(0)-474(3), such as an access line driver circuit. The driver circuits 474(0)-474(3) can be configured to condition a page of a respective block of an associated memory plane 472(0)-472(3) for a memory access operation, such as programming data (i.e., writing data), reading data, or erasing data. Each of the driver circuits 474(0)-474(3) can be coupled to a respective global access lines associated with a respective memory plane 472(0)-472(3). Each of the global access lines can be selectively coupled to respective local access lines within a block of a plane during a memory access operation associated with a page within the block. The driver circuits 474(0)-474(3) can be controlled based on signals from local media controller 135. Each of the driver circuits 474(0)-474(3) can include or be coupled to a respective power circuit, and can provide voltages to respective access lines based on voltages provided by the respective power circuit. The voltages provided by the power circuits can be based on signals received from local media controller 135.

The local media controller 135 can control the driver circuits 474(0)-474(3) and page buffers 476(0)-476(3) to concurrently perform memory access operations associated with each of a group of memory command and address pairs (e.g., received from memory sub-system controller 115). For example, local media controller 135 can control the driver circuits 474(0)-474(3) and page buffer 476(0)-476(3) to perform the concurrent memory access operations. Local media controller 135 can include a power control circuit that serially configures two or more of the driver circuits 474(0)-474(3) for the concurrent memory access operations, and an access control circuit configured to control two or more of the page buffers 476(0)-476(3) to sense and latch data from the respective memory planes 472(0)-472(3), or program data to the respective memory planes 472(0)-472(3) to perform the concurrent memory access operations.

In operation, local media controller 135 can receive a group of memory command and address pairs via the bus (e.g., NVMe or ONFI bus), with each pair arriving in parallel or serially. In some examples, the group of memory command and address pairs can each be associated with different respective memory planes 472(0)-472(3) of the memory array 470. The local media controller 135 can be configured to perform concurrent memory access operations (e.g., read operations or program operations) for the different memory planes 472(0)-472(3) of the memory array 470 responsive to the group of memory command and address pairs. For example, the power control circuit of local media controller 135 can serially configure, for the concurrent memory access operations based on respective page type (e.g., UP, TP, LP, XP, SLC/MLC/TLC/QLC page), the driver circuits 474(0)-474(3) for two or more memory planes 472(0)-472(3) associated with the group of memory command and address pairs. After the access line driver circuits 474(0)-474(3) have been configured, the access control circuit of local media controller 135 can concurrently control the page buffers 476(0)-476(3) to access the respective pages of each of the two or more memory planes 472(0)-472(3) associated with the group of memory command and address pairs, such as retrieving data or writing data, during the concurrent memory access operations. For example, the access control circuit can concurrently (e.g., in parallel and/or contemporaneously) control the page buffers 476(0)-476(3) to charge/discharge bitlines, sense data from the two or more memory planes 472(0)-472(3), and/or latch the data.

Based on the signals received from local media controller 135, the driver circuits 474(0)-474(3) that are coupled to the memory planes 472(0)-472(3) associated with the group of memory command and address command pairs can select blocks of memory or memory cells from the associated memory plane 472(0)-472(3), for memory operations, such as read, program, and/or erase operations. The driver circuits 474(0)-474(3) can drive different respective global access lines associated with a respective memory plane 472(0)-472(3). As an example, the driver circuit 474(0) can drive a first voltage on a first global access line associated with the memory plane 472(0), the driver circuit 474(1) can drive a second voltage on a third global access line associated with the memory plane 472(1), the driver circuit 474(2) can drive a third voltage on a seventh global access line associated with the memory plane 472(2), etc., and other voltages can be driven on each of the remaining global access lines. In some examples, pass voltages can be provided on all access lines except an access line associated with a page of a memory plane 472(0)-472(3) to be accessed. The local media controller 135, the driver circuits 474(0)-474(3) can allow different respective pages, and the page buffers 476(0)-476(3) within different respective blocks of memory cells, to be accessed concurrently. For example, a first page of a first block of a first memory plane can be accessed concurrently with a second page of a second block of a second memory plane, regardless of page type.

The page buffers 476(0)-476(3) can provide data to or receive data from the local media controller 135 during the memory access operations responsive to signals from the local media controller 135 and the respective memory planes 472(0)-472(3). The local media controller 135 can provide the received data to memory sub-system controller 115.

It will be appreciated that the memory device 130 can include more or less than four memory planes, driver circuits, and page buffers. It will also be appreciated that the respective global access lines can include 8, 16, 32, 64, 128, etc., global access lines. The local media controller 135 and the driver circuits 474(0)-474(3) can concurrently access different respective pages within different respective blocks of different memory planes when the different respective pages are of a different page type. For example, local media controller 135 can include a number of different processing threads, such as processing threads 434(0)-434(3). Each of processing threads 434(0)-434(3) can be associated with a respective one of memory planes 472(0)-472(3), or a respective group of memory planes, and can manage operations performed on the respective plane or group of planes. For example, each of processing threads 434(0)-434(3) can provide control signals to the respective one of driver circuits 474(0)-474(3) and page buffers 476(0)-476(3) to perform those memory access operations concurrently (e.g., at least partially overlapping in time). Since the processing threads 434(0)-434(3) can perform the memory access operations, each of processing threads 434(0)-434(3) can have different current requirements at different points in time. The PPM component can determine the power budget needs of processing threads 434(0)-334(3) in a given power management cycle and identify one or more of processing threads 434(0)-434(3) using one of a number of power budget arbitration schemes described herein. The one or more processing threads 434(0)-434(3) can be determined based on an available power budget in the memory subsystem 110 during the power management cycles. For example, the PPM component can determine respective priorities of processing threads 434(0)-434(3), and allocate current to processing threads 434(0)-434(3) based on the respective priorities.

Figure 5:
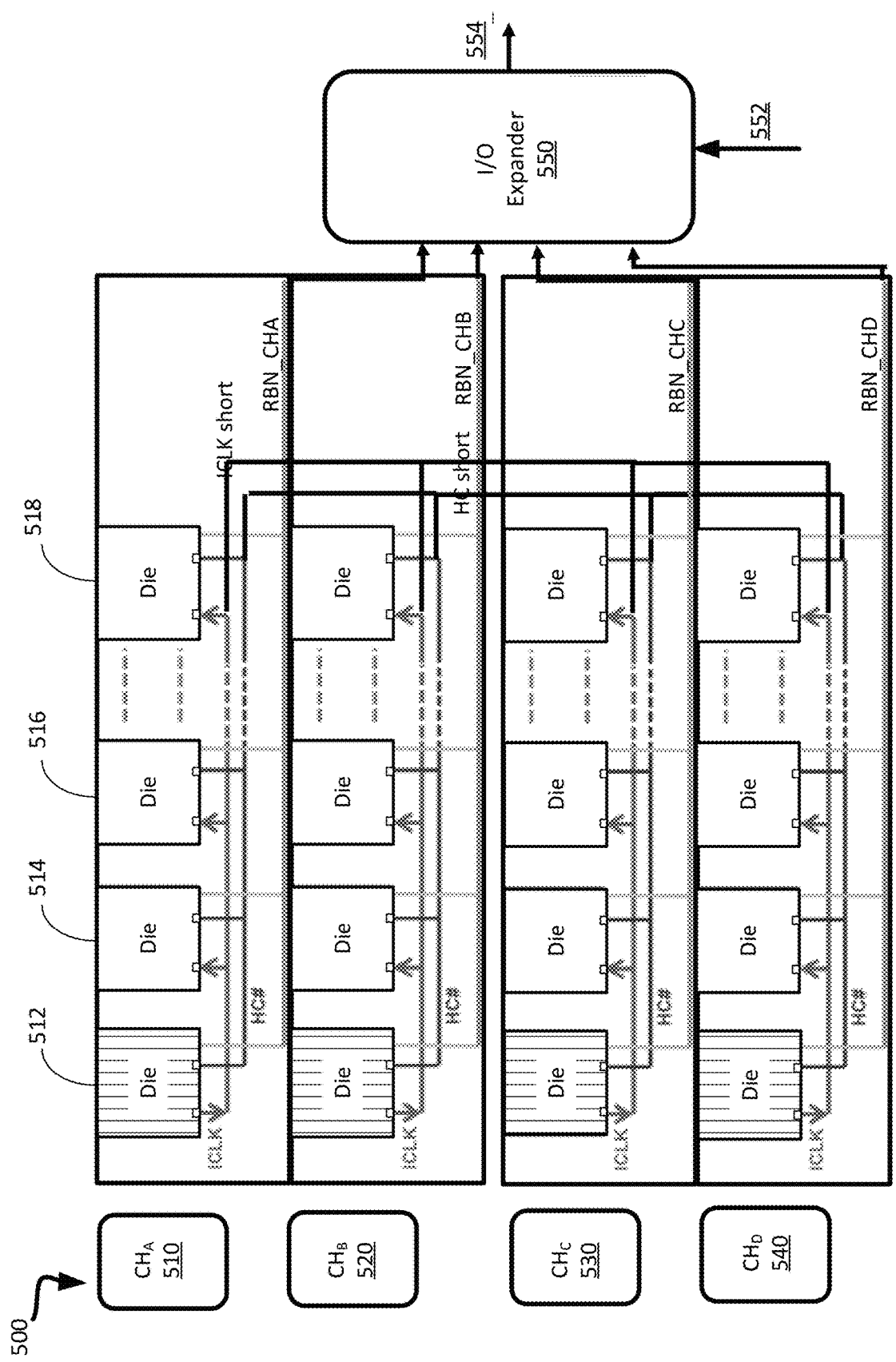
FIG. 5 is a block diagram illustrating an overview of a system including an input/output (I/O) expander to support peak power management (PPM), in accordance with some embodiments of the present disclosure.

FIG. 5 is a block diagram of an example system 500, in accordance with some embodiments of the present disclosure. As shown, the system 500 includes a number of channels 510 ($CH_A$) through 540 ($CH_D$), and each of the channels 510-540 corresponds to a respective set of memory dies ("dies"). For example, channel 510 can correspond to a set of dies including dies 512-518. In this illustrative example, 4 channels are shown each including 4 dies, for a total of 16 dies. However, the system 500 can include any suitable number of channels and/or dies. Accordingly, the channels 510-540 and corresponding sets of dies collectively form a multi-die memory device package. In one embodiment, the memory dies are all integrated in a single package (e.g., represented by memory device 130). In another embodiment, the memory dies associated with each channel are part of separate packages.

In some embodiments, each set of channels includes a primary die and a number of secondary dies. For example, with respect to channel 510, die 512 is a primary die and dies 514 through 518 are secondary dies. For example, die 512 can generate a clock signal (ICLK) used to synchronize the set of dies corresponding to channel 510. A similar arrangement is shown with respect to other sets of dies corresponding to respective ones of the other channels 520 through 540. The dies with each set of dies can further implement a peak current magnitude indicator signal (HC #). As further shown, the system 500 further includes an ICLK short and an HC # short.

As further shown, an RB signal is generated by each set of dies. For example, the set of dies corresponding to channel 510 generate an RB signal "RBN_CHA", the set of dies corresponding to channel 520 generate an RB signal "RBN_CHB", the set of dies corresponding to channel 530 generate an RB signal "RBN_CHC", and the set of dies corresponding to channel 540 generate an RB signal "RBN_CHD". The I/O expander 550 can receive the RB signals and at least one command 552 to create an RB signal short with respect to any desired combination of channels 510-540. For example, the I/O expander 550 can create an RB signal short respect to channels 510 and 520. As another example, the expander 550 can create an RB signal short with respect to channels 530 and 540. As yet another example, the IOE expander 550 can create an RB signal short with respect to all of the channels 510-540. Such combinations of channels should not be considered limiting. The I/O expander 550 can output a horizontal driving signal "RBN_HST" 554, which can be received by a system printed circuit board (PCB) or other suitable component operatively coupled to the system 500. RBN_HST 554 can include an output of at least one of the multiplexer, AND logic, or IOE component. A controller can monitor RBN_HST 554 to identify a status of the dies of the system 500. For example, when a memory device boots up, the memory sub-system controller can configure the I/O expander 550 to see if all of the dies are ready to accept commands. For example, if the AND logic outputs 1, RBN_HST 554 can indicate that all of the dies are ready and can accept commands.

The I/O expander 500 can include a number of components. The at least one command 552 can be used to configure one or more of the components to satisfy different applications. As will be now described in further detail below with reference to FIGS. 6-7, the I/O expander 500 can include a multiplexer (MUX) and/or AND logic, and an I/O expander (IOE) component.

Figure 6A:
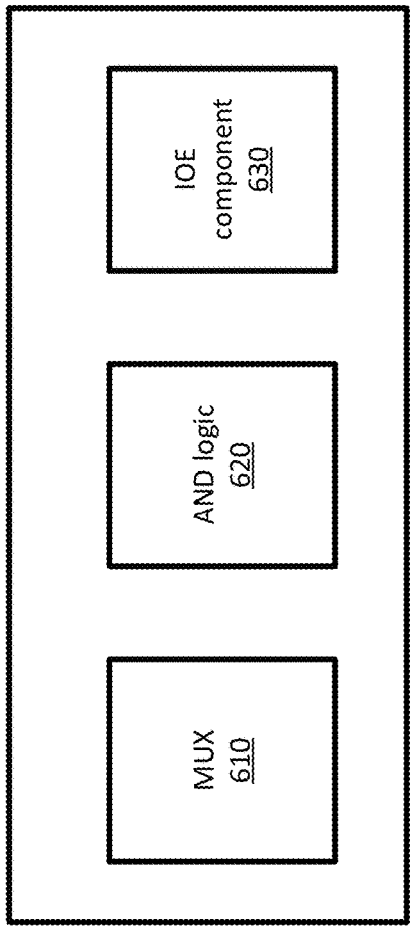
FIGS. 6A-6B are block diagrams illustrating an example input/output (I/O) expander, in accordance with some embodiments of the present disclosure.
Figure 6B:
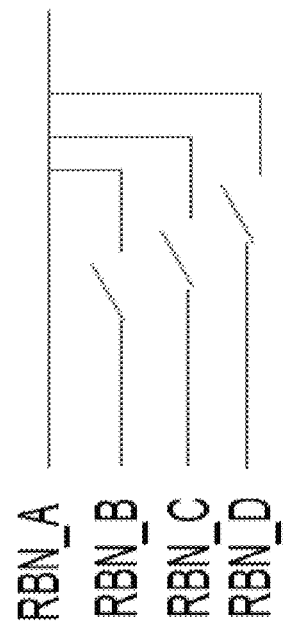

FIGS. 6A-6B are diagrams illustrating an example I/O expander 600, in accordance with some embodiments of the present disclosure. The I/O expander 600 can be implemented within a multi-die memory device having a number of channels each corresponding to a set of dies. For example, the I/O expander 600 can be similar to the I/O expander 550 described above with reference to FIG. 5.

As shown, the I/O expander 600 includes a number of components, including a multiplexer (MUX) 610, AND logic 620, and an I/O expander (IOE) component 630. As described above with reference to FIG. 5, the I/O expander 600 can receive a number of RB signals each corresponding to a respective channel of the multi-die memory device. The MUX 610 can be used to select an RB signal ("back-end" RB signal) from a number of RB signals, and the AND logic 620 can be used to generate an AND logic output from each of the RB signals. For example, if the multi-die memory device has 4 channels $CH_A$ through $CH_D$, the MUX 610 can be a 4 channel MUX and the AND logic 620 can be a 4 channel AND logic.

The IOE component 630 can be similar to the IOE component 137 of FIGS. 1A-1B. For example, the IOE component 630 can create an RB signal short (e.g., back-end RB signal short) with respect to any desired combination of channels of the multi-die memory device. For example, in a four-channel implementation, the IOE component 630 can create an RB signal short with respect to $CH_A$ and $CH_B$. As another example, in the four-channel implementation, the IOE component 630 can create an RB signal short with respect to $CH_C$ and $CH_D$. As yet another example, in the four-channel implementation, the IOE component 630 can create an RB signal short with respect to $CH_A$ through $CH_D$. Such combinations of channels should not be considered limiting. Accordingly, the IOE component 630 can include an RB signal shorting component. An illustrate example of an IOE component will now be described below with reference to FIG. 7.

Figure 7:
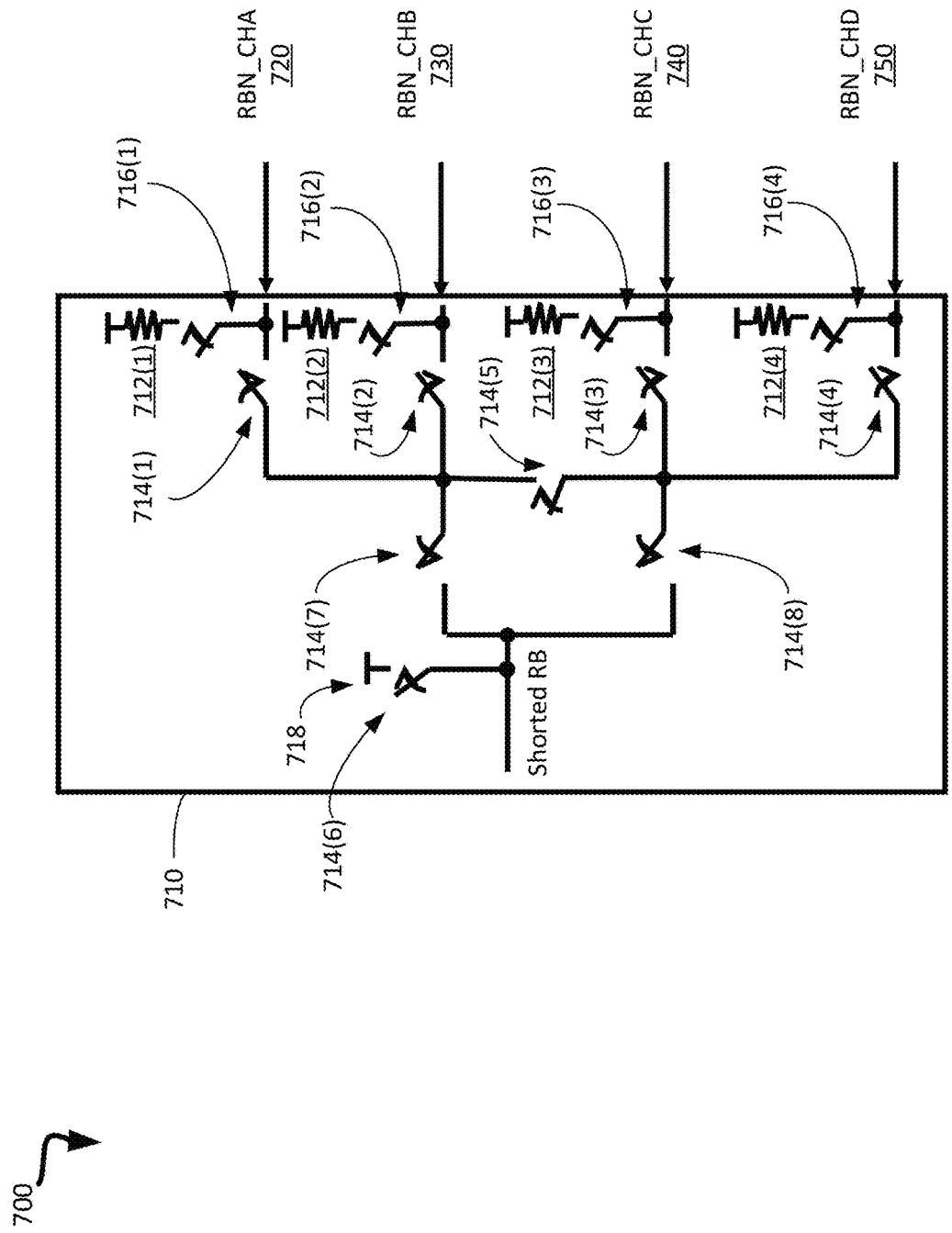
FIG. 7 is a schematic diagram illustrating a system including an example input/output expander (IOE) component, in accordance with some embodiments of the present disclosure.

FIG. 7 is a schematic diagram illustrating a system 700 including an example input/output expander (IOE) component 710, in accordance with some embodiments of the present disclosure. The IOE component 710 can be similar to the IOE component 137 described above with reference to FIG. 1, or the IOE component 630 described above with reference to FIG. 6. In this illustrative example, the IOE component 710 can include a number of resistors 712(1) through 712(4), a first set of switches including switches 714(1) through 714(8), and a second set of switches including switches 716(1) through 716(4). More specifically, the resistors 712(1) through 712(4) are pull-up resistors, and switches 716(1) through 716(4) are pull-up circuit switches that provide pull-up circuit options for the resistors 712(1) through 712(4). The IOE component 710 can further include a pin 718. In some embodiments, the pin 718 is a power pin. For example, the pin 718 can be an output stage logic power voltage (VCCQ) pin. A VCCQ pin can be used to supply power to the output transistors of a memory device to drive the load applied to the data output (Q) pins or data input/output (DQ) pins.

The IOE component 710 can receive a number of RB signals each corresponding to a respective channel. For example, as shown, the IOE component 710 can receive an RBN_CHA signal 720 corresponding to channel A, an RBN_CHB signal 730 corresponding to channel B, an RBN_CHC signal 740 corresponding to channel C, and an RBN_CHD signal 750 corresponding to channel D. Further details regarding the RB signals are described above.

The IOE component 710 can receive at least one command to create an RB signal short (e.g., back-end RB signal short) with respect to any desired combination of channels, and create the RB signal short in response based on the at least one command. For example, the command can be a set feature command (e.g., FA87h[3:2] command).

The switches 714(1) through 714(8) are RB shorting switches used to control RB shorts with respect to a desired combination of channels. Switches 714(1) through 714(8) can be referred to as switch A ($SW_A$) through switch H ($SW_H$), respectively. For example, the at least one command can control which of the switches 714(1) through 714(8) should be open or closed, which can enable the IOE component 710 to short the RB signals 720 through 750 together in different combinations. In this illustrative four-channel implementation, the IOE component 710 can create respective RB signal short pairs with respect to $CH_A$ and $CH_B$, and $CH_C$ and $CH_D$. Here, either the $CH_A/CH_B$ short signals or the $CH_C/CH_D$ short signals can then be selectively output to an external signal (e.g., to RBN_HST), depending the combination of switches that are opened/closed. As another example, in this illustrative four-channel implementation, the IOE component 710 can create an RB signal short with respect to $CH_A$ through $CH_D$, such that the RB signals of $CH_A$ through $CH_B$ are all shorted together and the short signal will be output to the external signal (e.g., RBN_HST). Such combinations of RB signal shorts should not be considered limiting. Further details regarding controlling RB signal shorts that are output utilizing various combinations of switches will now be described in further detail below with reference to FIG. 8. Accordingly, the IOE component 710 can trigger clock (e.g., ICLK) synchronization among various sets of dies corresponding to respective ones of the channels, which can enable the I/O expander to provide PPM support.

Figures 8, 9:
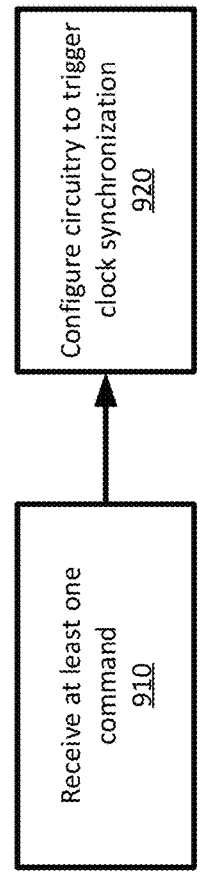
FIG. 8 is a table 800 illustrating example combinations of RB signal shorts that can be achieved using an input/output expander (IOE) component, in accordance with some embodiments of the present disclosure.
FIG. 9 is a flow diagram of a method to implement an input/output (I/O) expander for supporting peak power management (PPM), in accordance with some embodiments of the present disclosure.

FIG. 8 is a table 800 illustrating example combinations of RB signal shorts that can be achieved using an IOE component, in accordance with some embodiments of the present disclosure. More specifically, table 800 shows combinations of opened and closed switches of the IOE component 700 that each correspond to a particular signal output by the IOE component 700. The signal output by the IOE component 700 can be output to an external signal (e.g., RBN_HST).

For example, the table 800 includes a number of columns 802 and 805(1) through 805(8). Column 802 includes entries each corresponding to a respective type of short 810 that is achieved by a particular combination of open/closed switches. Columns 805(2) through 805(9) each includes entries corresponding to a respective open/closed state of a respective one of the switches $SW_A$ 714(1) through $SW_H$ 714(8) described above with reference to FIG. 7.

The top row of the table 800 ("first row") defines a switch configuration for a short type "N/A". This switch configuration causes the RB signals of each of the channels $CH_A$ through $CH_D$ to be disconnected from each other. More specifically, switches 714(1) through 714(4) are open, while switches 714(5) through 714(8) are closed. Since SWF 714(6) is closed, the signal is sent to the pin 718 described above with reference to FIG. 7.

The row of the table 800 beneath the first row ("second row") defines a switch configuration for a short type "$CH_A$-$CH_D$". This switch configuration causes the RB signals of each of the channels $CH_A$ through $CH_D$ to be shorted together to obtain a short signal. More specifically, SWF 714(6) is the only switch of switches 714(1) through 714(8) to be open.

The row of the table 800 beneath the second row ("third row") defines a switch configuration for a short type "$CH_A$+$CH_B$". This switch configuration causes the RB signals of channels $CH_A$ and $CH_B$ to be shorted together and the RB signals of channels $CH_A$ and $CH_B$ to be shorted together, where only the $CH_A$/$CH_B$ short signal is output to the external signal. More specifically, $SW_E$ 714(5), SWF 714(6) and $SW_H$ 714(8) are the only switches of switches 714(1) through 714(8) to be open.

The row of the table 800 beneath the third row ("fourth row") defines a switch configuration for a short type "$CH_C$+$CH_D$". This switch configuration causes the RB signals of channels $CH_A$ and $CH_B$ to be shorted together and the RB signals of channels $CH_A$ and $CH_B$ to be shorted together, where only the $CH_C$/$CH_D$ short signal is output to the external signal. More specifically, $SW_E$ 714(5) through $SW_G$ 714(7) are the only switches of switches 714(1) through 714(8) to be open.

FIG. 9 is a flow diagram of a method 900 to implement an I/O expander for supporting PPM, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the IOE component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, at least one command is received. For example, processing logic can receive at least one command to trigger clock synchronization. The at least one command can be received from the memory sub-system controller. In some embodiments, the clock synchronization is ICLK synchronization during PPM initialization with respect to a multi-die memory device. The multi-die memory device can include a number of sets of dies, with each set of dies corresponding to a respective channel. Each channel can correspond to a respective set of dies and a respective RB signal. In some embodiments, the at least one command includes a set feature command (e.g., FA87h[3:2] command).

Illustratively, if the RB signals of the dies are shorted together, the RB signal can be pulled down if any die runs a command (e.g., program, erase, read, independent word-line read). The falling edge of the RB signal and pull down status can be monitored by the primary die, which can learn if some die is running a command. Thus, the primary die can initiate clock driving and toggling to trigger clock synchronization. However, if the RB signals of the dies are not all shorted together, such that some the RB signal for some die N is not shorted with the RB signal of the primary die, then die N can run a command without the primary die knowing. Thus, the primary die will not know to trigger clock synchronization.

Therefore, at operation 920, circuitry is configured to trigger clock synchronization. For example, the processing logic, in response to receiving the at least one command, can cause RB signal shorting circuitry of an I/O expander to be configured to create an RB signal short with respect to a particular combination of the channels. The RB signal shorting circuitry can include any suitable circuit elements. In some embodiments, the RB signal shorting circuitry can include a number of switches. The processing logic can control, based on the at least one command, a state with respect to each switch of the plurality of switches to create the RB signal short. More specifically, the processing logic can determine which of the switches to open and which of the switches to close to create the RB signal short, and achieve a combination of open switches and closed switches based on the determination. Further details regarding implementing an I/O expander for supporting PPM are described above with reference to FIGS. 5-8.

Figure 10:
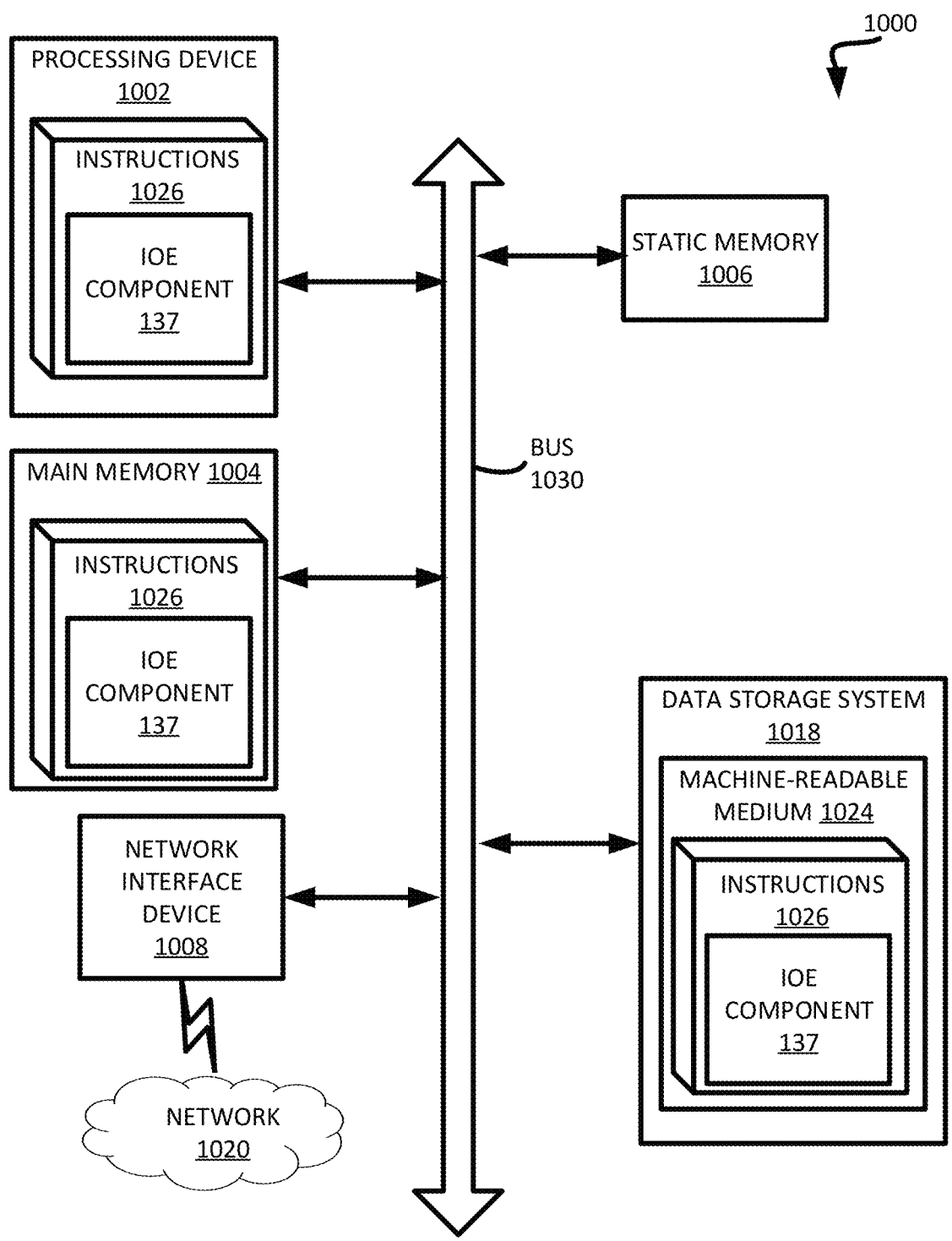
FIG. 10 is a block diagram of an example computer system in which embodiments of the present disclosure may operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the IOE component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or RDRAM, etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1A.

In one embodiment, the instructions 1026 include instructions to implement functionality corresponding to an IOE component (e.g., the IOE component 137 of FIG. 1A). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a plurality of sets of memory dies, wherein each set of memory dies comprises a plurality of memory dies associated with a respective channel of a plurality of channels, each channel of the plurality of channels having a respective ready busy (RB) signal; and
    an input/output (I/O) expander coupled to the plurality of sets of memory dies by the plurality of channels, the I/O expander to perform operations comprising:
        receiving at least one command to perform peak power management (PPM) clock synchronization associated with a clock signal with respect to the plurality of sets of memory dies, wherein the PPM clock synchronization is associated with PPM initialization; and
        in response to receiving the at least one command to perform the PPM clock synchronization, causing circuitry of the I/O expander to be configured to trigger the PPM clock synchronization by creating one or more targeted RB signal shorts with respect to a particular combination of channels of the plurality of channels.

2. The memory device of claim 1, wherein the circuitry comprises a plurality of switches, and wherein causing the circuitry of the I/O expander to be configured to trigger the PPM clock synchronization by creating the RB signal short comprises controlling a state with respect to each switch of the plurality of switches to create the one or more targeted RB signal shorts.

3. The memory device of claim 1, wherein the at least one command comprises a set feature command.

4. The memory device of claim 1, wherein the one or more targeted RB signal shorts correspond to at least one of all channels of the plurality of channels, or a pair of channels of the plurality of channels.

5. The memory device of claim 1, wherein the plurality of channels comprises 4 channels, and the plurality of memory dies comprises 4 memory dies.

6. The memory device of claim 1, wherein the plurality of memory dies comprises a primary die and a secondary die, and wherein the primary die is to generate the clock signal.

7. The memory device of claim 1, wherein the I/O expander further comprises at least one of: a multiplexer or AND logic.

8. An input/output (I/O) expander comprising:
circuitry to perform operations comprising:
receiving at least one command to perform peak power management (PPM) clock synchronization associated with a clock signal with respect to a plurality of sets of memory dies, wherein the PPM clock synchronization is associated with PPM initialization, and wherein each set of memory dies comprises a plurality of memory dies associated with a respective channel of a plurality of channels, each channel of the plurality of channels having a respective ready busy (RB) signal; and
in response to receiving the at least one command to perform the PPM synchronization, causing the circuitry to be configured to trigger the PPM clock synchronization by creating one or more targeted RB signal shorts with respect to a particular combination of channels of the plurality of channels.

9. The I/O expander of claim 8, wherein the circuitry comprises a plurality of switches, and wherein causing the circuitry of the I/O expander to be configured to trigger the PPM clock synchronization by creating the RB signal short comprises controlling a state with respect to each switch of the plurality of switches to create the one or more targeted RB signal shorts.

10. The I/O expander of claim 8, wherein the at least one command comprises a set feature command.

11. The I/O expander of claim 8, wherein the one or more targeted RB signal shorts correspond to at least one of all channels of the plurality of channels, or a pair of channels of the plurality of channels.

12. The I/O expander of claim 8, wherein the plurality of channels comprises 4 channels, and the plurality of memory dies comprises 4 memory dies.

13. The I/O expander of claim 8, wherein the plurality of memory dies comprises a primary die and a secondary die, and wherein the primary die is to generate the clock signal.

14. The I/O expander of claim 8, further comprising at least one of: a multiplexer or AND logic.

15. A method comprising:
receiving, by an I/O expander, at least one command to perform peak power management (PPM) clock synchronization associated with a clock signal with respect to a plurality of sets of memory dies, wherein the PPM clock synchronization is associated with PPM initialization, and wherein each set of memory dies comprises a plurality of memory dies associated with a respective channel of a plurality of channels, each channel of the plurality of channels having a respective ready busy (RB) signal; and
in response to receiving the at least one command to perform the PPM clock synchronization, causing, by the I/O expander, the PPM clock synchronization to be triggered by creating one or more targeted RB signal shorts with respect to a particular combination of channels of the plurality of channels.

16. The method of claim 15, wherein causing the PPM clock synchronization to be triggered comprises controlling a state with respect to each switch of a plurality of switches to create the one or more targeted RB signal shorts.

17. The method of claim 15, wherein the at least one command comprises a set feature command.

18. The method of claim 15, wherein the one or more targeted RB signal shorts correspond to at least one of all channels of the plurality of channels, or a pair of channels of the plurality of channels.

19. The method of claim 15, wherein the plurality of channels comprises 4 channels, and the plurality of memory dies comprises 4 memory dies.

20. The method of claim 15, wherein the plurality of memory dies comprises a primary die and a secondary die, and wherein the primary die is to generate the clock signal.

* * * * *